United States Patent [19]

Rensch et al.

[11] Patent Number: 4,569,124

[45] Date of Patent: Feb. 11, 1986

[54] METHOD FOR FORMING THIN CONDUCTING LINES BY ION IMPLANTATION AND PREFERENTIAL ETCHING

[75] Inventors: David B. Rensch, Thousand Oaks; John Y. Chen, Los Angeles, both of Calif.

[73] Assignee: Hughes Aircraft Company, El Segundo, Calif.

[21] Appl. No.: 613,114

[22] Filed: May 22, 1984

[51] Int. Cl.$^4$ .................. H01L 21/28; H01L 21/302; H01L 21/425

[52] U.S. Cl. ..................... 29/591; 29/576 B; 29/571; 148/1.5; 148/DIG. 83; 148/DIG. 147; 148/DIG. 19; 148/33; 156/628; 357/71

[58] Field of Search ...................... 29/571, 576 B, 578, 29/591; 148/33, 1.5, DIG. 77, DIG. 82, DIG. 83, DIG. 84, DIG. 91, DIG. 92, DIG. 93, DIG. 94, DIG. 128, DIG. 153, DIG. 147, DIG. 19; 156/628, 643; 357/71 S, 71 R, 65

[56] References Cited

U.S. PATENT DOCUMENTS

| | | | |
|---|---|---|---|
| 3,637,381 | 1/1972 | Hallman et al. | 156/628 X |
| 3,637,383 | 1/1972 | Hallman et al. | 156/628 X |
| 3,650,743 | 3/1972 | Hallman et al. | 156/628 X |
| 4,059,461 | 11/1977 | Fan et al. | 148/DIG. 93 X |
| 4,093,503 | 6/1978 | Harris et al. | 156/628 |
| 4,333,226 | 6/1982 | Abe et al. | 29/576 B |
| 4,418,470 | 12/1983 | Naster et al. | 29/576 B X |
| 4,526,624 | 7/1985 | Tombrello et al. | 29/576 B X |

FOREIGN PATENT DOCUMENTS 0208142 12/1982 Japan ................... 156/628

OTHER PUBLICATIONS

Poate et al., "Laser-Induced Reactions of Platinum & Other Metal Films with Silicon", App. Phys. Lett. 33(1), Dec. 1, 1978, pp. 918-920.

Primary Examiner—Brian E. Hearn
Assistant Examiner—David A. Hey
Attorney, Agent, or Firm—A. W. Karambelas; John A. Sarjeant

[57] ABSTRACT

A thin conducting line such as a gate pattern is defined on a semiconductor chip (10) by applying a narrow ion beam, suitably a focused-ion-beam (16) having a submicrometer thickness from a source (18) onto a thin layer (14) of an inorganic material such as silicon or aluminum overlying a layer (12) of refractory metal on a substrate (11). The ion beam is translated to form a gate pattern at a dose between about 0.1 to $50 \times 10^{15}$ cm$^{-2}$ and an energy from about 1 to 1000 KeV. Ions are implanted into the silicon and aluminum layers and into the underlying portions of the refractory metal layer and to render the exposed portions of the layers preferentially resistant to wet-etchant. The portions of layers which are not exposed nor protected by layers which are exposed, are preferentially removed to form a gate. Conventional MOSFET or MESFET processing to implant ions to form source and drain regions may then be performed.

22 Claims, 12 Drawing Figures

METHOD FOR FORMING THIN CONDUCTING LINES BY ION IMPLANTATION AND PREFERENTIAL ETCHING

The Government has rights in this invention pursuant to Contract No. 81F597000 awarded by the United States Government.

BACKGROUND OF THE INVENTION

This invention relates to the fabrication of extremely small conducting lines such as gates and, more particularly, to a resistless technique for forming such conducting lines on MOSFET (Metal-Oxide-Semiconductor Field Effect Transistor) or MESFET (Metal-Semiconductor Field Effect Transistor) devices.

Density and speed of integrated circuits are advancing rapidly as the Large Scale Integration (LSI) circuits have been replaced with Very Large Scale Integration (VLSI) circuits. Currently these circuits or circuit elements have features of the order of micrometers which are manufactured by delineating patterns to permit plating, etching and doping on a micrometer scale. Though some patterns are defined by direct writing of beams onto a surface, most devices are fabricated utilizing masks. The use of masks usually limits features to about 1 to 2 micrometers in size, whereas direct writing permits features having dimensions of submicrometers.

The features are usually defined by forming apertures in masks through which dopants, metal contacts, and electrodes are added; subsequent selective etching is utilized to form the final microcircuit geometry desired. The mask is generally formed in a layer of organic material called a resist. Problems associated with resist masks include poor resolution, swelling, adherence, pin-holes and lack of repeatability. All these factors limit minimum dimensions. Commercial optical lithographic processes must use complicated multiple organic resist layers to produce circuits with submicrometer geometry.

Recent advances in electron beam lithography have involved the use of direct-writing electron beam tools and systems replacing optical lithography. Electron beam lithography provides faster production of circuits since no masks are required. Though some experimental e-beam resists capable of producing submicrometer lines have been announced, the problems associated with resists remain. Though ion beam lithography, as disclosed in U.S. Pat. No. 4,383,026, offers some advantages over e-beam lithography, such as less backscatter and some improvement in resolution, it is still a polymeric resist-based process subject to many of the limitations previously discussed.

It has been shown that ion beams at certain energy and dose thresholds cause ion-induced mixing at the interface between a thin refractory metal layer and a monocrystalline or polycrystal silicon substrate. This produces a material with different etching properties (Tsai, et al., "Refractory Metal Silicide Formation Induced by As+ Implantation," *Appl. Phys. Lett.*, Vol. 37, p. 295, 1980). Wang, et al. (*J. Vac. Sci. Technol.*, Vol. 19, (4), p. 1158, 1981) disclose a focused ion beam (FIB) for exposure of an ion sensitive resist. Pankove, et al. ("Bombardment-Induced Corrosion Resistance of Aluminum," *Appl. Phys. Lett.*, Vol. 39, p. 119, July 1981) and Gulkeberger (U.S. Pat. No. 3,982,729) show that after bombardment of aluminum films with various ions, the films resist etching. However, there is no known process in which selective ion mixing has been utilized in the fabrication of semiconductor devices. Prior art semiconductor processing uses either positive or negative organic polymeric resists and pattern transfer techniques involving wet/dry etching or lift-off.

Many integrated circuits comprise interconnected MOSFETs or MESFETs. Integrated circuit chips based on FETs usually contain an interconnect metal layer, a doped polysilicon gate layer (MOS), an implant or a diffusion layer, and an insulating oxide layer. Paths are formed in these layers and contacts are cut through the insulating layer to connect certain points between layers. For example, wherever a path on the polysilicon layer crosses over a thin portion of the oxide layer registered between two doped regions in the implant layer, a MOSFET transistor is formed. Circuits of such transistors, connected by patterned paths on these layers, form the basic circuits from which integrated systems are generated.

The rectangular region where the doped polysilicon crosses between the doped regions is called the gate. The polysilicon gate and the thin layer of oxide beneath it are often utilized to effectively mask the region under the gate during the implant of the two doped regions. The gate, separated from the substrate by the layer of thin oxide, effectively forms a capacitor which acts as a switch. When positive charge exceeds threshold, electrons flow to the implanted region or diffusion layer. The dimension of the gate which separates the doped drain and source regions (known as the length, L) affects both the packing density of circuit elements and the speed of the integrated circuit.

SUMMARY OF THE INVENTION

In accordance with the invention, an improved method of defining extremely small conducting lines such as gates on semiconductor devices having lengths in the submicrometer region is provided. The method of the invention eliminates the use of organic resists to define such lines and therefore the problems associated with resist masks such as pin-holes, swelling, lack of repeatability and pattern size limitations.

Small conducting lines such as gates are defined in the process of the invention through a series of process steps. First, a substrate is provided; the substrate may comprise a bare semiconductor top surface when a MES device is to be fabricated, or an oxide-coated semiconductor top surface when a MOS device is to be fabricated. A first layer of metal is applied over the top surface of the substrate. Subsequently, a second layer of inorganic material is applied over the first layer of metal. A narrow ion beam is applied to the second and first layers so that exposed portions of the second layer are rendered preferentially etchant-resistant, the exposed interfacial portion of the first layer is rendered preferentially etchant-resistant, and portions of the first layer underlying the previously described etchant-resistant portions are protected during subsequent etching steps.

A wet etchant is used to selectively remove the areas of the second layer which are not rendered preferentially etchant-resistant. Subsequently, an etchant is used to remove areas of the first layer which are not rendered preferentially etchant-resistant and areas which are not protected by the etchant-resistant first layer portion and second layer. When the features of the pattern to be created require verticle walls with no substantial undercutting within the first layer of metal, a wet etchant is used to remove the areas of this first layer which are not etchant-resistant and not protected. When the features of the pattern to be created require a "T" shape in which a portion of the first layer of metal is to be undercut, a reactive gas plasma, which acts as an etchant, is used to remove areas of this first layer which are not preferably etchant-resistant and to remove significant portions of the first layer underlying the etchant-resistant portion, which would have been protected had a wet etchant been used.

In the event that the second layer is silicon and the first layer a refractory metal, the narrow ion beam when applied to a silicon layer simultaneously causes ion implantation into the silicon layer and ion-induced mixing at the interface between the silicon and refractory metal layers to form an interfacial region of ion-implanted refractory metal silicide. Some of the ions from the beam will also be implanted into the interfacial region. The ions implanted into the silicon layer render it preferentially resistant to etching. The interfacial region of ion-implanted refractory metal silicide is also preferentially resistant to etching.

Lines as small as about 0.10 $\mu$m long and about 100 $\mu$m wide have been produced utilizing the method of the invention. The limit of line size is thus determined only by the ability to focus the spot size of the ion beam rather than by resist resolution. Because of the small size of the conducting lines, circuits containing gates formed by the process of the present invention can be densely packed into a chip and are extremely fast. The circuits which can be fabricated are comparable to those containing submicron size polysilicon gates; however, since the gate formed by the process of the present invention is metal, the resistance across the gate is intrinsically lower than that of a polysilicon gate. Thus, a circuit fabricated using the metal gates formed by the process of the present invention should be faster. While actual operating speeds have not yet been measured, D.C. characteristics of devices fabricated using the process of the present invention indicate that operating speed of the metal gates exceeds that for any previously known metal gates.

These and many other features and attendant advantages of the invention will become apparent as the invention becomes better understood by reference to the following detailed description when considered in conjunction with the accompanying drawings.

DETAILED DESCRIPTION OF THE INVENTION

Figure 1A:
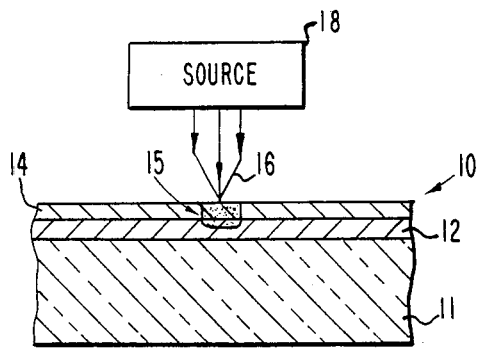
FIGS. 1a and b are a block and schematic view of the general steps of the gate defining process of the invention.

Referring now to FIG. 1, the process of the invention operates on a chip 10 prior to fabrication of the gate. The chip comprises a semiconductor substrate 11 which can be doped n or p. A thin film 12 of refractory metal is applied to the surface of the substrate 11. The substrate 11 can be monocrystalline silicon or a wider band gap material such as gallium arsenide. The refractory metal comprises at least one metal selected from the group consisting of molybdenum, titanium, tungsten and the like. A thin layer 14 of metal or semiconductor which can be selectively rendered etchant-resistant upon ion bombardment is coated onto the refractory metal as shown in FIG. 1a. The layer 14 is suitably formed of a metal such as aluminum or a material capable of ion-induced mixing with the refractory metal to form an interfacial non-implanted agglomeration resistant to etchant. One example of a material which suitably mixes is silicon, which forms etchant-resistant ion-implanted silicides at the refractory metal interface under the conditions of the process of the invention. The silicon layers applied may be thin enough to be substantially transparent to the ion beam, usually having a thickness from about 100 Angstroms to 5000 Angstroms. The thickness of the interfacial refractory metal silicide compound formed is typically less than about 100 Angstroms.

Figure 1B:
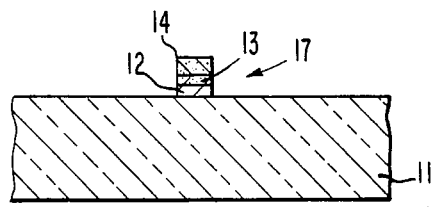

It is possible to deposit a thin layer of silicon, typically less than 150 Angstroms, in order to obtain total mixing during ion beam exposure. The result is a surface layer of ion-implanted refractory metal silicide over the refractory metal layer. On the other hand, a thicker layer of silicon, typically greater than 150 Angstroms can be utilized so that after ion beam exposure the surface layer 14 comprises ion-implanted silicon, followed by a layer of ion-implanted metal silicide 13, followed by the refractory metal layer 12, as shown in FIG. 1b.

A gate pattern 15 comprising micrometer to submicrometer lines is defined in the layer 14 by applying a focused ion beam 16 (FIB) from source 18. The beam can be translated relative to the substrate by moving the source, deflecting the beam or translating the substrate. A pattern 17 is developed by removing non-exposed portions of layer 14 and unprotected refractory metal 12 with etchant as shown in FIG. 1b. Preferably, the ion beam should not contain ions that are a dopant for the substrate 11. For example, silicon beams should be used to define gate patterns in silicon substrates. An arsenic ion beam can be used to process gallium arsenide substrates. The beam should have an energy sufficient to produce ion-induced mixing, which is generally from about 1 to 1000 KeV, and preferentially from about 50 to 500 KeV. The dose should be maintained between about 0.1 to 50×10$^{15}$ cm$^{-2}$ and preferentially between about 1 to 3×10$^{15}$ cm$^{-2}$.

Figure 2A:
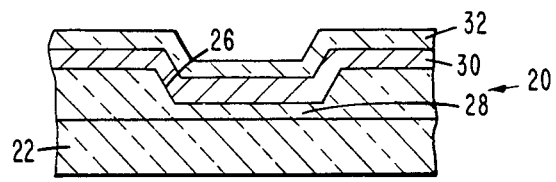
FIGS. 2a-c are a block and schematic view of a process for forming a MOSFET gate according to the process of the invention.
Figure 2B:
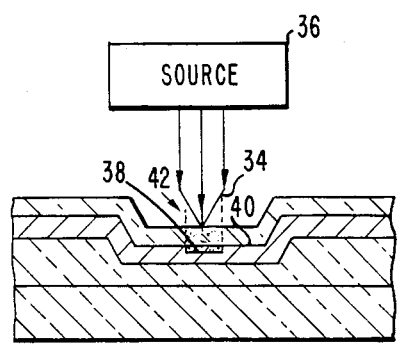

The preferred process for forming a gate on a MOSFET device is illustrated in FIG. 2. As shown in FIG. 2a, a typical MOSFET wafer 20 is formed of a substrate 22 containing a channel 26. A thin film 28 of oxide remains in the bottom of the channel. A refractory metal layer 30 is applied to the oxide layer. A further layer 32 of silicon is applied and then subjected to a FIB 34 from source 36. The beam penetrates the silicon layer 32 and through the interface of metal layer 30 forming a thin zone 38, preferably about 50 to 100 Angstroms thick of ion-implanted metal silicide at the interface 40.

The material in the silicon and metal layers exposed to the beam 34, as shown within the area defined by 42, is simultaneously rendered resistant to etchant. The etch rate of the exposed portions can decrease by a factor of at least 10.

Figure 2C:
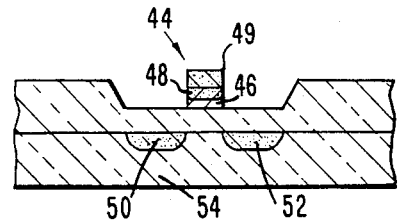

Referring now to FIG. 2c, after the wafer 20 of FIG. 2a is exposed to the beam and subjected to silicon and refractory metal etchants, a line 44 remains, comprising a line 46 of refractory metal, a cap 48 of ion-implanted metal silicide and a cap 49 of ion-implanted silicon. Device manufacture is completed by state-of-the-art processing to implant ions to form a source region 50 on one side of the line 44 and a drain region 52 on the other side. The area 54 underlying the line 44 is the channel region. Contacts are made as appropriate to fabricate a finished device.

EXAMPLES

A submicrometer W-Ti gate was formed on a n-MOSFET according to the process of FIG. 2. All gate lithography was performed using a three-lens, mass separated, focused ion beam system (Wang, et al., supra) with a Au—Si alloy liquid metal ion source capable of emitting $Si^{++}$ ions from a single ion emitter tip. The current density at the wafer surface was approximately $4 \times 10^{-2}$ A/cm$^2$. The shape of the gate lithography and the dose delivered was controlled by a pattern generator coupled to an electrostatic deflector in the FIB system. The smallest pixel step used was 40 nm and multiple passes were used to fix the total ion doses.

The process steps employed for fabrication of Si/W-Ti gate on a silicon wafer are outlined below:

Example 1

| Step | Process Description |
|---|---|
| 1. | Gate oxide formation. |
| 2. | Sputter about 2000 Å W-Ti followed by about 800 Å Si. |
| 3. | Pattern using FIB; 100 KeV, 2 to 10 × 10$^{15}$ cm$^{-2}$ dose, silicon ions. |
| 4. | Preferential etch of Si: aqueous KOH |
| 5. | Preferential etch of W-Ti: 30 percent H$_2$O$_2$ solution. |
| 6. | Rinse in H$_2$O. |
| 7. | Inspection by SEM. |

Using the above process, lines about 0.1 μm in length and about 50 to 90 μm in width have been produced using Si and W-Ti layers.

Example 2

A Si/Mo gate on silicon was fabricated according to the process of Example 1.

Figure 5:
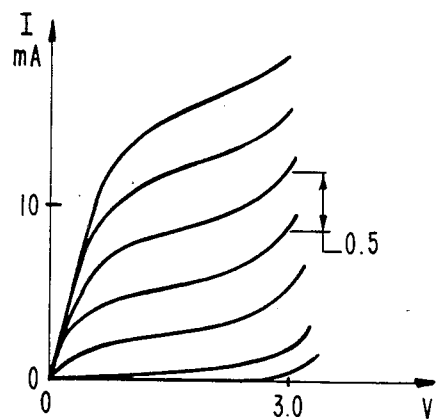
FIG. 5 depicts the I-V (current-voltage) characteristics of a MOSFET prepared on a 14 nm thick silicon oxide with a gate length of 0.75 $\mu$m.

| Step | Process Description |
|---|---|
| 1. | Gate oxide formation. |
| 2. | Deposit about 2000 Å Mo followed by about 1000 Å Si. |
| 3. | Pattern using FIB; about 100 KeV, 1 to 3 × 10$^{15}$ cm$^{-2}$ dose, silicon ions. |
| 4. | Preferential etch of Si: aqueous KOH |
| 5. | Preferential etch of Mo: 30 percent H$_2$O$_2$ solution. |
| 6. | Rinse in H$_2$O. | n-MOSFETs have been fabricated with the Si/W-Ti gates using conventional MOSFET processing. Gate lengths varied between 2 and 0.15 μm. Transconductances as large as 180 miliseconds per milimeter were obtained. I-V characteristics of a MOSFET on a 14 nm thick silicon oxide with a gate length (L) of 0.75 μm and a gate width (W) of 50 μm, which was produced using the above process are shown in FIG. 5.

Figure 3A:
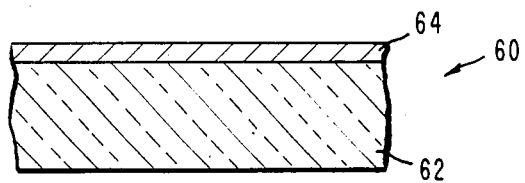
FIGS. 3a-c are a block and schematic view of a process for forming a MESFET gate according to the invention.
Figure 3B:
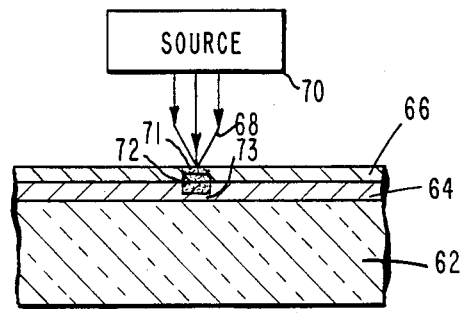
Figure 3C:
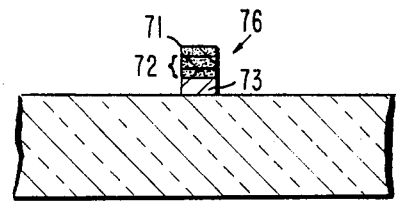

Referring now to FIG. 3, a gate for a MESFET is formed on a wafer 60 of wide band gap semiconductor 62 to which a layer 64 of refractory metal has been applied as shown in FIG. 3a. Then, as shown in FIG. 3b, metal layer 64 is further coated with a layer 66 of silicon and the composite is exposed to a focused ion beam 68 from ion source 70 to form an ion-implanted silicon zone 71, a zone 72 of ion-implanted metal silicide and underlying etchant-resistant column 73 of W-Ti metal. When the composite shown in FIG. 3b is etched, the non-exposed portions of the silicon layer 66 and the metal film 64 which is not underlying the exposed portion of the silicon layer dissolve to form a line 76 comprising ion-implanted silicon 71, ion-implanted metal silicide 72, and refractory metal 73.

Example 3

A GaAs chip was processed according to the method of Example 1 and 2 except that the first step for oxide formation was omitted. Lines of Mo and W-Ti having similar dimensions to those produced in Examples 1 and 2 were formed.

Example 4

Figure 4A:
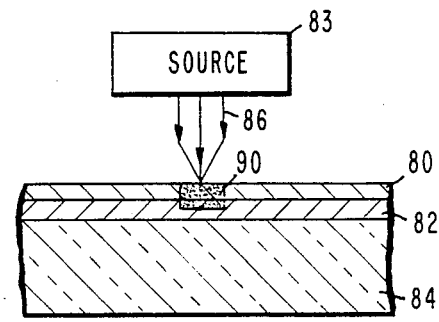
FIGS. 4a-c are a block and schematic view of another process for forming a MESFET gate according to the invention.
Figure 4B:
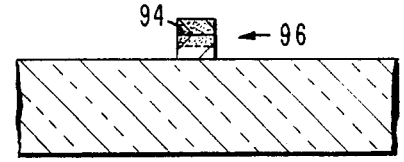
Figure 4C:
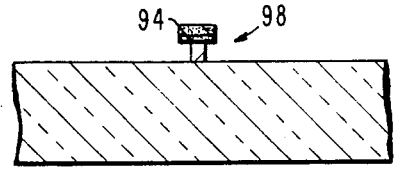

A process for forming a T-gate for a MESFET is illustrated in FIG. 4. A thin (200 Å to 5000 Å) film 80 of aluminum is deposited over the refractory metal layer 82 on the GaAs substrate 84. The focused ion beam 86 from source 88 is used to form a preferentially etchant-resistant gate pattern 90 in the aluminum film 80. The dosage and energies are similar to those discussed above. All areas in which the film 80 is exposed to the ion beam are resistant to chemical etching. After chemical etching of the non-exposed aluminum, the refractory metal 83 can be wet-etched to form pattern 96 or the aluminum cap 94 can be used as a plasma etch mask for the W-Ti 82 and to form pattern 98. During plasma etching, the underlying portion of refractory metal which is not etchant-resistant is removed to form a T-gate 98. The cap layer 94 acts as a mask during drain-source ion implantation.

An Al/W-Ti gate on a GaAs substrate was fabricated according to the process outlined below.

| Step | Process Description |
|---|---|
| 1. | Deposit about 2000 Å W-Ti followed by about 1500 Å Al. |
| 2. | Pattern using FIB; about 100 KeV, 1 to 3 × 10$^{15}$ cm$^{-2}$ dose, silicon ions. |
| 3. | Preferential etch of Al: aluminum chemical etch. |
| 4. | Plasma etch using CF$_4$ + O$_2$ to remove W-Ti. |
| 5. | Rinse in H$_2$O. |

Example 5

A GaAs chip is produced according to the method of Example 4 except that the patterning is done using a focused ion beam wherein the ions are arsenic and the dosage is that appropriate for arsenic ion implantation. Use of an arsenic beam prevents potential undesired doping of the GaAs substrate.

The process of the invention can be utilized to define submicrometer or larger conductor lines on any insulator or semiconductor substrate by forming a pattern in an overlying layer of silicon or aluminum or other material that is rendered selectively resistant to etchant after being subjected to a FIB. The underlying refractory metal layer can also undergo ion implantation and ion-induced mixing with the overlying layer and become preferentially etchant-resistant compared to the surrounding unexposed metal. The invention eliminates the use of positive or negative organic resist masks. The process of the invention results in 1/1 transfer of pattern from the exposed layer into the refractory metal layer with no significant undercutting, using wet etchants. If aluminum is used as a mask, Reactive Ion Etching (RIE) using a plasma gas can be used to control any desired undercutting for T-gate formation.

It is to be realized that only preferred embodiments of the invention have been described and that numerous substitutions, modifications and alterations are permissible without departing from the spirit and scope of the invention as defined in the following claims.

What is claimed is:

1. A method for forming conducting lines within microcircuits by ion implantation and preferential etching comprising the steps of:
    (a) providing a substrate;
    (b) applying a first layer of metal over a major surface of said substrate;
    (c) applying a second layer of inorganic material over said first layer of metal;
    (d) applying a narrow ion beam to said second and first layers so that said second layer is rendered preferentially etchant-resistant, a portion of said first layer is rendered preferentially etchant-resistant, and portions of said first layer underlying said etchant-resistant portion are protected during subsequent etching steps; and
    (e) selectively removing the areas of said second layer which are not rendered preferentially etchant-resistant, areas of said first layer which are not rendered preferentially etchant-resistant, and areas which are not protected by said etchant-resistant portions of said first and second layers.

2. The method of claim 1 wherein said substrate is selected from the group consisting of insulators and semiconductors.

3. The method of claim 2 wherein said substrate is a semiconductor and said ion of step (d) is a non-dopant in said semiconductor.

4. The method of claim 3 wherein said semiconductor is selected from the group consisting of silicon and III-V compounds.

5. The method of claim 4 wherein said substrate is silicon and includes a surface layer of silicon oxide between said silicon surface and said first layer of metal.

6. The method of claim 1 wherein said first layer of metal is a refractory metal.

7. The method of claim 1 wherein said second layer of inorganic material is selected from the group consisting of silicon and aluminum.

8. The method of claim 1 wherein said narrow ion beam is a focused ion beam.

9. The method of claim 8 further including the step of translating said ion beam relative to said second layer to form lines in the configuration of a gate for a FET.

10. The method of claim 9 wherein said substrate is a semiconductor and further including the step of implantating dopant ions to form source and drain regions in said substrate on both side of the gate.

11. The method of claim 10 wherein said ion beam has an energy from about 1 to 1,000 KeV and a dose of about 0.1 to $50 \times 10^{15}$ cm$^{-2}$.

12. The method of claim 8 wherein said ion beam has a width of less than 1 micrometer.

13. The method of claim 1 wherein said ion beam penetrates through said second layer and into said first layer.

14. The method of claim 13 wherein said second layer is less than about 150 Angstroms thick and said ion beam dosage is sufficiently low that said second layer becomes an integral part of the upper portion of said first layer due to mixing occurring during ion implantation so that the resultant combination becomes an etchant-resistant zone.

15. The method of claim 13 wherein said second layer is sufficiently thick that an ion-implanted second layer is obtained and said beam penetration beneath said second layer into said first layer results in interfacial mixing between said first and second layers wilth simultaneous ion implantation, wherein said interfacial area becomes an etchant-resistant zone.

16. The method of claim 15 wherein said second layer is silicon and said beam penetration into said first layer results in the interfacial area between said first layer and said second layer becoming a zone of etchant-resistant ion-implanted metal silicide.

17. A wafer for use in forming a FET device comprising:
    a semiconductor substrate;
    a first layer of refractory metal formed on said substrate; and
    a second layer of inorganic material formed on said first layer, wherein portions of said second layer are rendered preferentially resistant to etchant when said portions are implanted with ions having an energy above 1 KeV and a dose of 0.1 to $15 \times 10^{15}$ cm$^{-2}$.

18. The wafer according to claim 17 wherein said second layer is selected from the group consisting of aluminum and silicon.

19. The wafer according to claim 17 further including a layer of oxide between the substrate and the first layer of metal.

20. The wafer according to claim 17 wherein said portions of said first layer underlying the ion-implanted portions of said second layer contain an etchant-resistant pattern, such pattern comprising interfacially mixed said first and second layers and implanted ions.

21. The wafer according to claim 20 in which said pattern contains lines having a length less than 1 micrometer.

22. The wafer according to claim 20 in which all but said etchant-resistant portions of both layers and portions of said first layer protected by said etchant-resistant portions have been removed.

* * * * *